United States Patent
Bennett et al.

(10) Patent No.: US 9,446,877 B1
(45) Date of Patent: *Sep. 20, 2016

(54) SYSTEM AND APPARATUS FOR APPLYING LABELS TO CABLE OR CONDUIT

(71) Applicant: Encore Wire Corporation, McKinney, TX (US)

(72) Inventors: Mark D. Bennett, Bonham, TX (US); William T. Bigbee, Jr., Melissa, TX (US); Steve Griffin, McKinney, TX (US)

(73) Assignee: Encore Wire Corporation, McKinney, TX (US)

(*) Notice: Subject to any disclaimer, the term of this patent is extended or adjusted under 35 U.S.C. 154(b) by 150 days.

This patent is subject to a terminal disclaimer.

(21) Appl. No.: 14/453,273

(22) Filed: Aug. 6, 2014

Related U.S. Application Data

(63) Continuation of application No. 13/091,897, filed on Apr. 21, 2011, now Pat. No. 8,826,960, which is a continuation-in-part of application No. 12/484,719, filed on Jun. 15, 2009, now Pat. No. 7,954,530.

(60) Provisional application No. 61/148,630, filed on Jan. 30, 2009.

(51) Int. Cl.
*B65C 3/02* (2006.01)
*B65C 9/42* (2006.01)
(Continued)

(52) U.S. Cl.
CPC . *B65C 3/02* (2013.01); *B65C 9/26* (2013.01); *H01L 21/67144* (2013.01);
(Continued)

(58) Field of Classification Search
CPC ............. B65C 3/02; B65C 9/42; B65C 9/08; B65C 9/26; Y10T 156/1744; Y10T 156/1033; Y10T 156/17; H01L 21/67144
USPC ................................ 156/391, 392, 581, 556
See application file for complete search history.

(56) References Cited

U.S. PATENT DOCUMENTS

| 242,813 A | 6/1881 | Chinnock |
| 277,248 A | 5/1883 | Edgerton |

(Continued)

FOREIGN PATENT DOCUMENTS

| CH | 449732 | 1/1968 |
| CH | 590544 | 5/1977 |

(Continued)

OTHER PUBLICATIONS

AFC Cable Systems, "Installation Pocket Guide" (No date available).

(Continued)

*Primary Examiner* — Sonya Mazumdar
(74) *Attorney, Agent, or Firm* — Warren Rhoades LLP

(57) ABSTRACT

A system for applying labels to cable or conduit including at least one label and a label applicator. The label applicator including at least one guide roller, at least one tamping device comprising at least one tamping pad for applying at least one label onto the moving cable or conduit, and a guide shoe assembly. The guide shoe assembly comprises a guide shoe, the guide shoe comprises a rounding member, a plurality of springs for providing flexibility to the rounding member when the moving cable or conduit passes the at least one guide shoe, a support mount for supporting the at least one guide shoe, a plurality of pivots disposed between the rounding member and the rounding member support for adjusting the set of springs, and a fitted member for providing an anchor for the at least one guide shoe to connect with the support mount.

20 Claims, 14 Drawing Sheets

(51) Int. Cl.
  *B65C 9/36* (2006.01)
  *H01L 21/67* (2006.01)
  *B65C 9/26* (2006.01)
  *B65C 9/08* (2006.01)

(52) U.S. Cl.
  CPC  *B65C 9/08* (2013.01); *B65C 9/42* (2013.01);
       *Y10T 156/1033* (2015.01); *Y10T 156/17*
       (2015.01); *Y10T 156/1744* (2015.01)

(56) References Cited

U.S. PATENT DOCUMENTS

| | | |
|---|---|---|
| 403,262 A | 5/1889 | Garland |
| 769,366 A | 9/1904 | Waterman |
| 817,057 A | 4/1906 | Greenfield |
| 840,766 A | 1/1907 | Greenfield |
| 951,147 A | 3/1910 | Porter |
| 1,068,553 A | 7/1913 | Abell |
| 1,383,187 A | 6/1921 | Brinkman et al. |
| 1,596,215 A | 5/1923 | Palmer |
| 1,617,383 A | 12/1923 | Fazio |
| 1,580,760 A | 4/1926 | Palmer |
| 1,617,583 A | 2/1927 | Fentress et al. |
| 1,781,574 A | 11/1930 | Frederickson |
| 1,913,390 A | 6/1933 | Hungerford |
| 1,976,804 A | 10/1934 | Ringel |
| 1,995,407 A | 3/1935 | Walker |
| 2,118,630 A | 1/1936 | Waldron |
| 2,070,679 A | 2/1937 | Pebock et al. |
| 2,086,152 A | 7/1937 | Bedell |
| 2,106,048 A | 1/1938 | Candy, Jr. |
| 2,125,869 A | 8/1938 | Atkinson |
| 2,234,675 A | 3/1941 | Johnson |
| 2,316,293 A | 4/1943 | Scott |
| 2,372,868 A | 2/1944 | Warren, Jr. |
| 2,379,318 A | 6/1945 | Safford |
| 2,402,357 A | 6/1946 | Bates |
| 2,414,923 A | 1/1947 | Batcheller |
| 2,446,387 A | 8/1948 | Peterson |
| 2,464,124 A | 3/1949 | Duvall |
| 2,504,178 A | 4/1950 | Burnham et al. |
| 2,591,794 A | 4/1952 | Ebel |
| 2,628,998 A | 2/1953 | Frisbie |
| 2,629,953 A | 3/1953 | Von Stackelberg et al. |
| 2,663,754 A | 12/1953 | Bianco |
| 2,688,652 A | 9/1954 | Schumacher |
| 2,745,436 A | 5/1956 | Battle et al. |
| 2,816,200 A | 12/1957 | Mudge |
| 2,818,168 A | 12/1957 | Tobey et al. |
| 2,885,739 A | 5/1959 | Staller |
| 2,914,166 A | 11/1959 | Bihler |
| 2,944,337 A | 7/1960 | Coleman |
| 3,020,335 A | 2/1962 | Gillis |
| 3,073,944 A | 1/1963 | Yuter |
| 3,197,554 A | 7/1965 | Baker |
| 3,287,490 A | 11/1966 | Wright |
| 3,311,133 A | 3/1967 | Kinander |
| 3,328,514 A | 6/1967 | Cogelia |
| 3,434,456 A | 3/1969 | Geating |
| 3,459,233 A | 8/1969 | Webbe |
| 3,459,878 A | 8/1969 | Gressitt et al. |
| 3,474,559 A | 10/1969 | Hunt |
| 3,551,542 A | 12/1970 | Perrone |
| 3,551,586 A | 12/1970 | Dembiak |
| 3,636,234 A | 1/1972 | Wakefield |
| 3,650,059 A | 3/1972 | Johnson |
| 3,650,862 A | 3/1972 | Burr |
| 3,682,203 A | 8/1972 | Foti et al. |
| 3,720,747 A | 3/1973 | Anderson et al. |
| 3,748,372 A | 7/1973 | McMahon et al. |
| 3,790,697 A | 2/1974 | Buckingham |
| 3,815,639 A | 6/1974 | Westerbarkey |
| 3,834,960 A | 9/1974 | Prentice et al. |
| 3,865,146 A | 2/1975 | Meserole |
| 3,913,623 A | 10/1975 | Siegwart |
| 3,938,558 A | 2/1976 | Anderson |
| 3,994,090 A | 11/1976 | Wheeler |
| 4,021,315 A | 5/1977 | Yanagida et al. |
| 4,028,902 A | 6/1977 | Courson et al. |
| 4,029,006 A | 6/1977 | Mercer |
| 4,029,129 A | 6/1977 | Harper |
| 4,109,099 A | 8/1978 | Dembiak et al. |
| 4,128,736 A | 12/1978 | Nutt et al. |
| 4,134,953 A | 1/1979 | Dembiak et al. |
| 4,139,936 A | 2/1979 | Abrams et al. |
| 4,141,385 A | 2/1979 | Siegwart |
| 4,154,976 A | 5/1979 | Brorein |
| 4,158,746 A | 6/1979 | Taylor et al. |
| 4,161,564 A | 7/1979 | Legbandt |
| 4,187,391 A | 2/1980 | Voser |
| 4,196,464 A | 4/1980 | Russell |
| 4,197,723 A | 4/1980 | Ehedy et al. |
| 4,197,728 A | 4/1980 | McGowen |
| 4,274,086 A | 6/1981 | Benckendorff et al. |
| 4,278,836 A | 7/1981 | Bingham |
| 4,280,225 A | 7/1981 | Willis |
| 4,284,842 A | 8/1981 | Arroyo et al. |
| 4,303,733 A | 12/1981 | Bulle et al. |
| 4,310,946 A | 1/1982 | Baker et al. |
| 4,319,940 A | 3/1982 | Arroyo et al. |
| 4,326,561 A | 4/1982 | Kutnyak |
| 4,328,394 A | 5/1982 | Aloisio, Jr. et al. |
| 4,329,561 A | 5/1982 | Schafer et al. |
| 4,340,773 A | 7/1982 | Perreault |
| 4,360,704 A | 11/1982 | Madry |
| 4,368,613 A | 1/1983 | Sanchez |
| 4,376,229 A | 3/1983 | Maul et al. |
| 4,406,914 A | 9/1983 | Kincaid |
| 4,423,306 A | 12/1983 | Fox |
| 4,424,627 A | 1/1984 | Tarbox |
| 4,465,717 A | 8/1984 | Crofts et al. |
| 4,477,298 A | 10/1984 | Bohannon, Jr. et al. |
| 4,499,010 A | 2/1985 | Tanio et al. |
| 4,528,420 A | 7/1985 | Kish et al. |
| 4,543,448 A | 9/1985 | Deurloo |
| 4,547,626 A | 10/1985 | Pedersen et al. |
| 4,549,755 A | 10/1985 | Kot et al. |
| 4,552,989 A | 11/1985 | Sass |
| 4,579,759 A | 4/1986 | Breuers |
| 4,584,238 A | 4/1986 | Gen et al. |
| 4,595,431 A | 6/1986 | Bohannon, Jr. et al. |
| 4,629,285 A | 12/1986 | Carter et al. |
| 4,636,271 A | 1/1987 | Gandolfo |
| 4,644,092 A | 2/1987 | Gentry |
| 4,701,575 A | 10/1987 | Gupta et al. |
| 4,719,320 A | 1/1988 | Strait, Jr. |
| 4,731,502 A | 3/1988 | Finamore |
| 4,746,767 A | 5/1988 | Gruhn |
| 4,749,823 A | 6/1988 | Ziemek et al. |
| 4,761,519 A | 8/1988 | Olson et al. |
| 4,770,729 A | 9/1988 | Spencer et al. |
| 4,778,543 A | 10/1988 | Pan |
| 4,868,023 A | 9/1989 | Ryan et al. |
| 4,880,484 A | 11/1989 | Obermeier et al. |
| 4,947,568 A | 8/1990 | De Barbieri |
| 4,956,523 A | 9/1990 | Pawluk |
| 4,963,222 A | 10/1990 | Bonjour et al. |
| 4,965,412 A | 10/1990 | Lai et al. |
| 4,970,352 A | 11/1990 | Satoh |
| 4,997,994 A | 3/1991 | Andrews et al. |
| 5,001,303 A | 3/1991 | Coleman et al. |
| 5,038,001 A | 8/1991 | Koegel et al. |
| 5,049,721 A | 9/1991 | Parnas et al. |
| 5,061,823 A | 10/1991 | Carroll |
| 5,078,613 A | 1/1992 | Salmon |
| 5,103,067 A | 4/1992 | Aldissi |
| 5,171,635 A | 12/1992 | Randa |
| 5,180,884 A | 1/1993 | Aldissi |
| 5,189,719 A | 2/1993 | Coleman et al. |
| 5,216,202 A | 6/1993 | Yoshida et al. |
| 5,250,885 A | 10/1993 | Kabeya |
| 5,289,767 A | 3/1994 | Montalto et al. |
| 5,350,885 A | 9/1994 | Falciglia et al. |
| 5,408,049 A | 4/1995 | Gale et al. |

(56) References Cited

U.S. PATENT DOCUMENTS

| | | |
|---|---|---|
| 5,444,466 A | 8/1995 | Smyczek et al. |
| 5,468,914 A | 11/1995 | Falciglia et al. |
| 5,468,918 A | 11/1995 | Kanno et al. |
| 5,470,253 A | 11/1995 | Siems et al. |
| 5,504,540 A | 4/1996 | Shatas |
| 5,527,995 A | 6/1996 | Lasky |
| 5,557,071 A | 9/1996 | Falciglia et al. |
| 5,651,081 A | 7/1997 | Blew et al. |
| 5,703,983 A | 12/1997 | Beasley, Jr. |
| 5,708,235 A | 1/1998 | Falciglia et al. |
| 5,719,353 A | 2/1998 | Carlson et al. |
| 5,775,935 A | 7/1998 | Barna |
| 5,777,271 A | 7/1998 | Carlson et al. |
| 5,862,774 A | 1/1999 | Moss |
| 5,887,368 A | 3/1999 | Rupp |
| 6,017,627 A | 1/2000 | Iwata et al. |
| 6,113,996 A | 9/2000 | Amon et al. |
| 6,311,637 B1 | 11/2001 | Moss |
| 6,486,395 B1 | 11/2002 | Temblador |
| 6,562,454 B2 | 5/2003 | Takahashi et al. |
| 6,651,362 B2 | 11/2003 | Caveney |
| RE38,345 E | 12/2003 | Falciglia et al. |
| 6,825,418 B1 | 11/2004 | Dollins et al. |
| 6,906,264 B1 | 6/2005 | Grant, Jr. et al. |
| 6,908,418 B2 | 6/2005 | Saure |
| 7,178,572 B2 | 2/2007 | Schanke et al. |
| 7,465,878 B2 | 12/2008 | Dollins et al. |
| 7,812,259 B2 | 10/2010 | Agan et al. |
| 7,954,530 B1 | 6/2011 | Bennett et al. |
| 8,347,533 B2 | 1/2013 | Hardin et al. |
| 8,540,836 B1 | 9/2013 | Hardin et al. |
| 8,708,018 B2 | 4/2014 | Boulay et al. |
| 2004/0098889 A1 | 5/2004 | Proctor |
| 2009/0001707 A1 | 1/2009 | Brooks |
| 2009/0095398 A1 | 4/2009 | Hardin et al. |

FOREIGN PATENT DOCUMENTS

| | | | |
|---|---|---|---|
| DE | 328905 | 11/1920 | |
| DE | 751575 | 10/1951 | |
| DE | 1902057 | 10/1964 | |
| DE | 1902057 U | * 10/1964 | ............... H01B 7/36 |
| DE | 4016445 | 8/1991 | |
| EP | 0318841 | 6/1989 | |
| FR | 763504 | 5/1934 | |
| GB | 189908045 | 0/1899 | |
| GB | 191511072 | 1/1916 | |
| GB | 194419 | 3/1923 | |
| GB | 212602 | 8/1923 | |
| GB | 275250 | 9/1927 | |
| GB | 332303 | 7/1930 | |
| GB | 478891 | 5/1937 | |
| GB | 629923 | 12/1948 | |
| GB | 691843 | 5/1953 | |
| GB | 905981 | 9/1962 | |
| GB | 913514 | 12/1962 | |
| GB | 1073340 | 6/1967 | |
| GB | 1117862 | 6/1968 | |
| GB | 1432548 | 4/1976 | |
| GB | 1490439 | 11/1977 | |
| GB | 2154785 | 9/1985 | |
| GB | 2314547 | 1/1998 | |
| JP | 49-020780 | 2/1974 | |
| JP | 52-023677 | 2/1977 | |
| JP | 52-121679 | 10/1977 | |
| JP | 55-120031 | 9/1980 | |
| JP | 57-143379 | 9/1982 | |
| JP | 59-087194 | 5/1984 | |
| JP | 60-097179 | 5/1985 | |
| JP | 62-037186 | 2/1987 | |
| JP | 54-081113 | 3/1989 | |
| JP | 1-134808 | 5/1989 | |
| JP | 3-025806 | 2/1991 | |
| JP | 3-173015 | 7/1991 | |
| JP | 4-163048 | 6/1992 | |
| JP | 4-312850 | 11/1992 | |
| NL | 65-10231 | 2/1966 | |
| WO | 8801247 | 2/1988 | |

OTHER PUBLICATIONS

Hamad et al., "United States Statutory Invention Registration No. H631", May 2, 1989.

Heinhold, Lothar, "Power Cables and their Application", Part 1:3rd revised edition 1990; ISBN-3-8009-1535-9; Section 14, pp. 124-133.

* cited by examiner

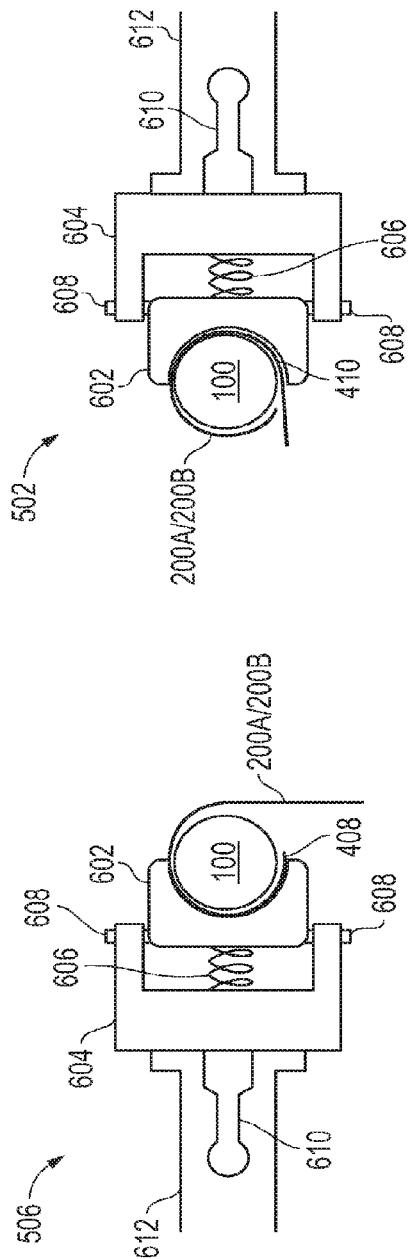
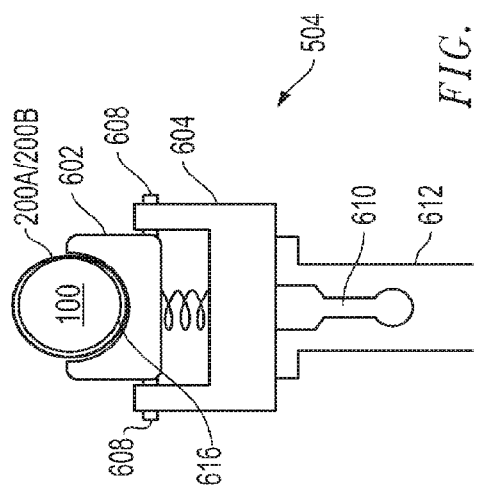
FIG. 6A
FIG. 6B
FIG. 6C

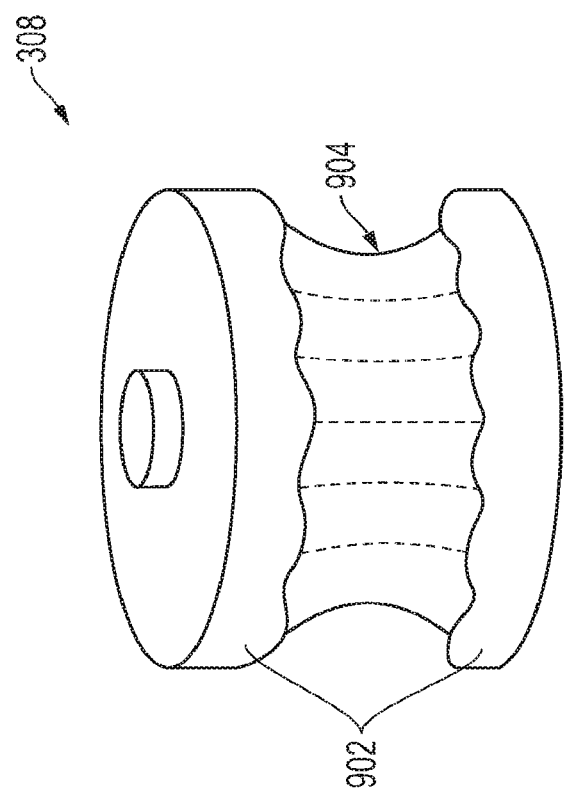

SYSTEM AND APPARATUS FOR APPLYING LABELS TO CABLE OR CONDUIT

CROSS-REFERENCE TO RELATED APPLICATIONS

This application is a continuation of U.S. patent application Ser. No. 13/091,897, filed Apr. 21, 2011, now issued as U.S. Pat. No. 8,826,960, issued Sep. 9, 2014, which is a Continuation-in-Part of application Ser. No. 12/484,719, filed Jun. 15, 2009, now issued as U.S. Pat. No. 7,954,530, issued Jun. 7, 2011, which claims the priority benefit of Provisional Application No. 61/148,630 filed Jan. 30, 2009, all of which are fully incorporated by reference herein.

BACKGROUND OF THE INVENTION

1. Field of the Invention

The present invention relates in general to applying labels to a cable or conduit, and more particularly, to a system and apparatus for applying labels to a moving cable or conduit.

2. Description of the Related Art

A cable or conduit generally consists of one or more internal conductors and a sheath that envelopes the one or more internal conductors. Labels are then applied to the sheath of the cable or conduit to identify characteristics of the cable or conduit, for example, the type and size of the cable or conduit. In the current state of the art, various methods are used to apply specific colors to cable or conduit and/or conduit. One method is to apply an ink directly to an outer sheath of the cable or conduit by spraying, wiping, dripping, brushing, etc. However, colors applied by this method may not be easily removed and the method in which the ink is applied may not be easily managed as liquid or powder is used. Therefore, a need exists for an apparatus and a method for applying colored labels to cable or conduit and/or conduit without the disadvantages of the existing methods.

BRIEF SUMMARY OF THE INVENTION

The present invention provides a system and apparatus for applying labels to a cable or conduit.

A system for applying labels to cable or conduit, the system comprising: at least one label, a label applicator for applying the label to the cable or conduit, the label applicator comprising at least one guide roller for guiding a moving cable or conduit, at least one tamping device comprising at least one tamping pad for applying at least one label onto the moving cable or conduit; and a guide shoe assembly, the guide shoe assembly comprising: a guide shoe mounted at a level that is horizontal and substantially even with the moving cable or conduit for pressing the label directly against at least a portion of the moving cable or conduit, wherein the guide shoe comprises a rounding member, a plurality of springs for providing flexibility to the rounding member when the moving cable or conduit passes the at least one guide shoe, a support mount for supporting the at least one guide shoe, a plurality of pivots disposed between the rounding member and the rounding member support for adjusting the set of springs, and a fitted member for providing an anchor for the at least one guide shoe to connect with the support mount.

A system for applying labels to cable or conduit, the system comprising: at least one label, a label applicator for applying the label to the cable or conduit, the label applicator comprising: at least one guide roller for guiding a moving cable or conduit, at least one tamping device comprising: at least one tamping pad for applying at least one label onto the moving cable or conduit, wherein the at least one tamping device comprises a set of hydraulics for driving the at least one tamping pad downward onto the moving cable or conduit, and a guide shoe assembly, the guide shoe assembly comprising: a plurality of guide shoes individually mounted at a level that is horizontal and substantially even with the moving cable or conduit for pressing the at least one label against a portion of the moving cable or conduit, wherein the plurality of guide shoes comprises: a rounding member, a rounding member support for supporting the rounding member, a plurality of springs for providing flexibility to the rounding member when the moving cable or conduit passes the at least one guide shoe, a support mount for supporting the at least one guide shoe, a plurality of pivots disposed between the rounding member and the rounding member support for adjusting the set of springs, and a fitted member for providing an anchor for the at least one guide shoe to connect with the support mount.

The following description and drawings set forth in detail a number of illustrative embodiments of the invention. These embodiments are indicative of but a few of the various ways in which the present invention may be utilized.

BRIEF DESCRIPTION OF THE SEVERAL DRAWINGS

A more complete appreciation of the present invention is provided by reference to the following detailed description of the appended drawings and figures. The following descriptions, in conjunction with the appended figures, enable a person having skill in the art to recognize the numerous advantages and features of the present invention by understanding the various disclosed embodiments. The following figures are utilized to best illustrate these features.

FIGS. 6A to 6C are diagrams illustrating side views of exemplary guide shoes in accordance with one embodiment of the present disclosure;

FIG. 9 is a diagram illustrating an exemplary guide roller in accordance with one embodiment of the present disclosure.

DETAILED DESCRIPTION OF THE INVENTION

The following discussion is presented to enable a person skilled in the art to make and use the invention. The general principles described herein may be applied to embodiments and applications other than those detailed below without departing from the spirit and scope of the present invention as defined by the appended claims. The present invention is not intended to be limited to the embodiments shown, but is to be accorded the widest scope consistent with the principles and features disclosed herein.

Figure 1:
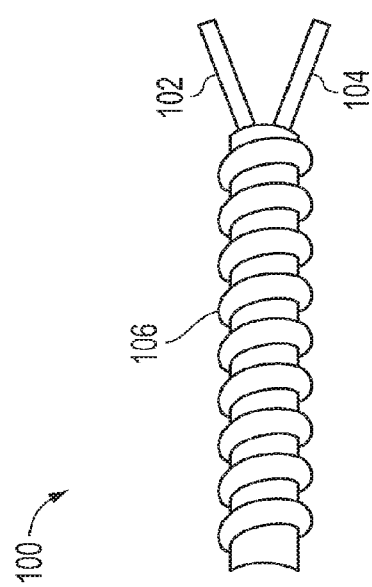
FIG. 1 is a diagram of an exemplary cable or conduit in accordance with one embodiment of the present disclosure.

Referring to FIG. 1, a diagram of an exemplary cable or conduit is depicted in accordance with one embodiment of the present disclosure. In this embodiment, cable or conduit 100 consists of one or more internal conductors 102 and 104. Internal conductors 102 and 104 are preferably insulated by an insulator and jacketed and are enveloped by a sheath 106. Sheath 106 may be made of a conducting material such as aluminum or steel. Cable or conduit 100 may also be of different types including, but not limited to, corrugated, interlocking, waterproof/liquid-tight, or flexible metal conduit.

Figure 2:
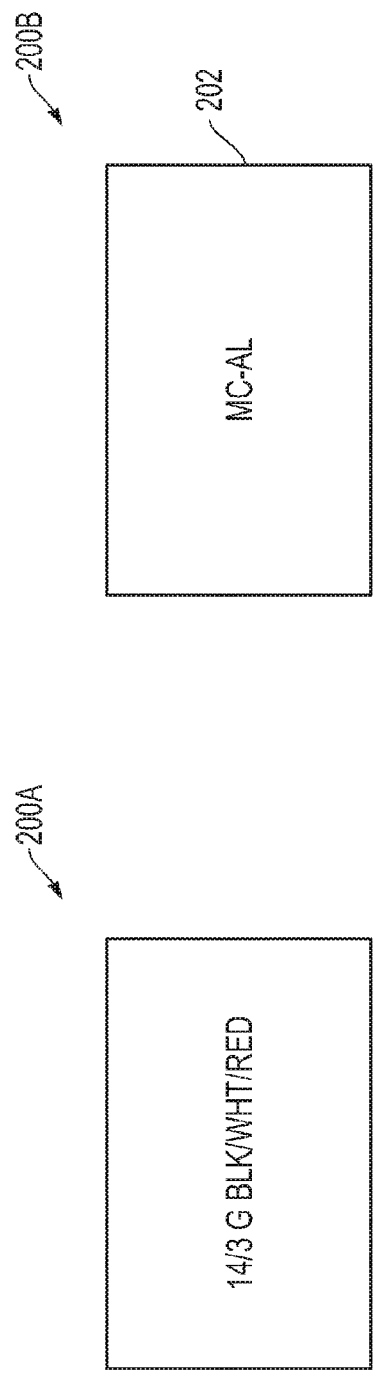
FIG. 2 is a diagram of exemplary labels for application to a cable or conduit in accordance with one embodiment of the present disclosure.

Referring to FIG. 2, a diagram of exemplary labels for application to a cable or conduit is depicted in accordance with one embodiment of the present disclosure. In this embodiment, labels 200A and 200B may be made with or without adhesive, which enables the removal of the label easier. Labels 200A and 200B may be conductive or non-conductive, and polymeric or metallic in nature. In one embodiment, labels 200A and 200B are of a polymeric heat-induced shrink-wrap type such that when labels 200A and 200B are heated, the labels shrink and wrap tightly around the sheath 106 of the cable or conduit 100 in a manner to be discussed further below. Labels other than heat-induced shrink-wrap type may also be used without departing the spirit and scope of the present disclosure.

Label 200A is color-coded edge-to-edge according to a color scheme. In one embodiment, label 200A is color-coded to indicate the internal conductor wire size according to the American Wire Gauge (AWG) standard. For example, label 200A is white in color, which indicates that the size of the internal conductors is 14AWG. The color scheme for the internal conductors wire size also includes a yellow color to indicate wire size of 12AWG; an orange color to indicate wire size of 10AWG; a black color to indicate wire size of 8AWG; a purple color to indicate wire size of 6AWG; a brown color to indicate wire size of 4AWG; a tan color to indicate wire size of 3AWG; a gold color to indicate wire size of 2AWG; and a pink color to indicate wire size of 1AWG. It is noted that colors other than those described above may be used to indicate the size of the internal conductors without departing the spirit and scope of the present disclosure. For example, a custom color instead of white may be used to indicate a 14AWG internal conductor.

Label 200A also comprises letters printed on the surface to indicate certain information about the cable or conduit and its internal conductors. The letters may be preprinted with selected lettering and/or numbering schemes in black, white, or other colored ink. In one embodiment, letters are printed on the surface of label 200A to indicate the size and/or number of internal conductors, whether a ground wire is present, and the actual colors of the internal conductors. For example, label 200A has printed letters "14/3 G Blk/Wht/Red", which indicates the following information about the cable or conduit: three internal conductors with a wire size of 14AWG, a ground wire is present, and the actual colors of the internal conductors are black, white, and red. It is noted that in addition to the above information, label 200A may be printed with letters to indicate other types of information relating to cable or conduit 100 and its internal conductors without departing from the spirit and scope of the present disclosure.

Label 200B is also color-coded edge-to-edge according a color scheme. In one embodiment, label 200B is color-coded to indicate the category of the cable or conduit 100. For example, label 200B is grey in color to indicate that a category of metal clad (MC) aluminum (AL) 202. The color scheme for the category also includes a green color to indicate a category of health care facility (HCF); a blue color to indicate a category of metal-clad steel (MC-SL); a white color to indicate a category of armored cable steel (AC-SL), a category of armored cable aluminum (AC-AL), a category of metal-clad (MC) oversize neutral, or a category of metal-clad (MC) isolated ground (ISG); a red color to indicate a category of metal-clad fire alarm (MC-FPLP); and a copper color to indicate a category of metal-clad smart ground (MC-SG).

It is noted that for the category of health care, both labels 200A and 200B will remain green in color even though a different color would have been used to indicate the size of the internal conductors. It is also noted that for the category of fire alarm, both labels 200A and 200B will remain red in color even though a different color would have been used to indicate the size of the internal conductors. It is also noted that for the category of multi-purpose (MP), both labels 200A and 200B will remain copper in color. Furthermore, colors other than those described above may be used to indicate the category of internal conductors without departing the spirit and scope of the present disclosure. For example, a custom color instead of grey may be used to indicate a metal-clad aluminum (MC-AL) internal conductor.

Label 200B also comprises letters printed on the surface to indicate the category of the internal conductors. The letters may be preprinted with selected lettering and/or numbering schemes in black, white, or other colored ink. For example, label 200B is printed with letters "MC-AL" to indicate a category of metal-clad (MC) aluminum (AL). Alternatively, label 200B is printed with letters "AC-HCF" to indicate that a category of armored cable (AC) health care facility cable (HCF). Other embodiments of category include letters "MC-FPLP" to indicate a category of metal clad (MC) fire alarm cable or conduit (FPLP), letter "MC-MLC" to indicate a category of metal clad (MC) multi-circuit (MLC), letters "MC-OSN" to indicate a category of metal clad (MC) oversized neutral (OSN), letters "MC-MLN" to indicate a category of metal-clad (MC) multineutral (MLN), letters "MC-SL" to indicate a category of metal clad (MC) steel (SL), letters "MC-ISG" to indicate a category of metal clad (MC) isolated ground (ISG), and letters "AC-AL" to indicate a category of armored cable (AC) aluminum cable, letters "AC-SL" to indicate a category of armored cable (AC) steel (SL) and letters "MC-SG" to indicated a category of metal-clad (MC) smart ground (SG).

Labels 200A and 200B may have different pre-printed type styles and font sizes. In addition, labels 200A and 200B may be of different sizes based on the spacing between labels on the moving cable or conduit 100. In this embodiment, a polymeric heat-induced shrink-wrap label is approximately 2¼" square before shrinkage. However, labels 200A and 200B may be smaller or larger in size based on the spacing between labels along the outer sheath 106 of the moving cable or conduit 100.

Figure 3:
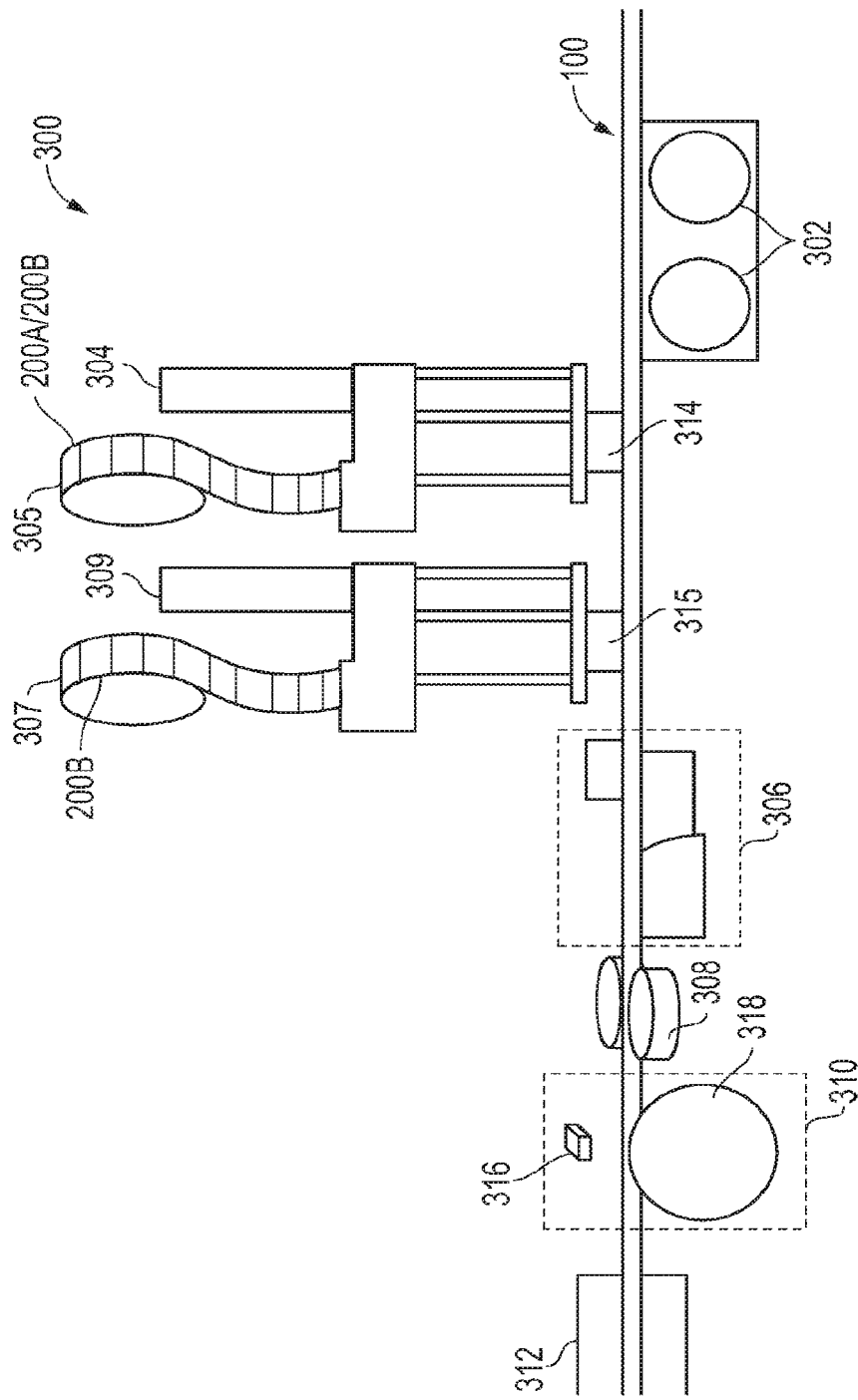
FIG. 3 is a diagram of an exemplary labeling unit for applying labels in accordance with one embodiment of the present disclosure.

Instead of applying ink directly to the outer sheath of the cable or conduit, the present disclosure applies labels, such as heat-induced shrink-wrap type labels 200A and 200B, to the cable or conduit 100, by feeding the moving cable or conduit to a labeling unit 300. Referring to FIG. 3, a diagram of an exemplary labeling unit 300 is depicted in accordance with one embodiment of the present disclosure. In this embodiment, labeling 300 includes a set of guide rollers 302, a first tamping device 304, a second tamping device 309, a guide shoe assembly 306, a set of parallel guide rollers 308, an optional encoding device 310, and an optional heated shrink-wrap tunnel 312.

In operation, cable or conduit 100 is fed continuously into the labeling unit 300 on a set of guide rollers 302. The size of the guide rollers 302 is interchangeable according to the overall diameter of the cable or conduit 100. A first tamping device 304 is provided in labeling unit 300 to apply labels, such as heat-induced shrink-wrap labels 200A, onto cable or conduit 100. In one embodiment, a first label roller 305 comprising a roll of labels is provided in labeling unit 300 to feed labels 200A into the first tamping device 304. Alternatively, the first label roller 305 comprising a roll of alternating labels 200A and 200B is provided in labeling unit 300 to feed the both labels 200A and 200B into the tamping device 304. Thus, in this alternative embodiment, only a single label roller 305 is necessary to apply both labels 200A and 200B to the cable or conduit 100.

In another embodiment, a second tamping device 309 is provided in labeling unit 300 to apply labels, such as heat-induced shrink-wrap labels 200B, onto cable or conduit 100. In this embodiment, a second label roller 307 comprising a roll of labels is provided in labeling unit 300 to feed labels 200B into the second tamping device 309. In this embodiment, the first tamping device 304 applies labels 200A from the first label roller 305 onto the cable or conduit 100 prior to the second tamping device 309 applying labels 200B from the second label roller 307 onto the cable or conduit 100. However, the second tamping device 309 is not limited to applying labels 200B and may apply labels 200A as an alternative.

Tamping devices 304 and 309 comprise tamping pads 314 and 315 respectively. Tamping pads 314 and 315 have a surface that comprises a groove, which fits the outer profile of the moving cable or conduit 100. When labels 200A and/or 200B are fed onto the surface of the tamping pad 314, a set of hydraulics push tamping pads 314 and 315 onto the moving cable or conduit 100, where the cable or conduit 100 fits into the groove of tamping pads 314 and 315. More details regarding tamping pads 314 and 315 are discussed with reference to FIG. 4A below.

After tamping devices 304 and 309 apply labels 200A and/or 200B to cable or conduit 100, cable or conduit 100 is fed into a guide shoe assembly 306, which directs the moving cable or conduit 100 while smoothing or rounding the labels 200A and/or 200B to tightly fit the outer profile of the moving cable or conduit 100. More details regarding the guide shoe assembly 306 are discussed with reference to FIG. 5 below. After passing through the guide shoe assembly 306, the moving cable or conduit 100 with applied labels 200A and/or 200B passes through a set of parallel guide rollers 308 that affix the labels 200A and/or 200B more firmly from the side. The distance between the set of parallel guide rollers 308 may be adjusted based on the diameter of the cable or conduit 100. The set of parallel guide rollers 308 also hold the cable or conduit 100 in place after it exits the guide shoe assembly 306.

The moving cable or conduit 100 then passes an optional encoding device 310 that comprises an attached sensor 316. The encoding device 310 regulates the frequency of label application by tamping devices 304 and 309 based on the speed of the moving cable or conduit 100. The attached sensor 316 receives a signal from the guiding wheel 318 as it rotates to guide moving cable or conduit 100 through the labeling unit 300 and controls the frequency of label application by tamping devices 304 and 309 based on the received signal. Other types of encoding devices 310 may also be used to regulate the frequency of label application without departing the spirit and scope of the present disclosure. For example, an automatic encoding device 310 that automatically monitors the frequency of label application based on timing of the last label application may also be used.

The moving cable or conduit 100 then enters an optional heated shrink-wrap tunnel 312 that affixes labels 200A and/or 200B more securely. The tunnel 312 applies heat to the applied labels 200A and/or 200B on the moving cable or conduit 100, such that it shrinks and wraps labels 200A and/or 200B around the outer profile of the cable or conduit 100 more securely. In one embodiment, the tunnel 312 is mounted to a frame at a height that is compatible with the location of the moving cable or conduit 100. After the moving cable or conduit exits the optional heated shrink-wrap tunnel 312, the cable or conduit with affixed labels 200A and/or 200B exits the labeling unit 300.

The labeling unit 300 may be implemented either inline with the manufacturing process or offline in a separate process. Labeling unit 300 provides an apparatus that is easier to apply or remove labels. In addition, labeling unit 300 makes managing application of labels easier, because the process is free from liquid or powder which makes it easier to clean up. It is noted that methods other than heated shrink-wrap for applying labels 200A and 200B may be implemented without departing the spirit and scope of the present disclosure. For example, a method for applying labels with adhesive may be implemented using the labeling unit 300. In that case, the guide shoe assembly 306 may be modified such that opposing ends of labels 200A and 200B are joined after labels 200A and 200B pass the guide shoe assembly. More details regarding modification of the guide shoe assembly 306 are discussed with reference to FIG. 5 below.

Figure 4A:
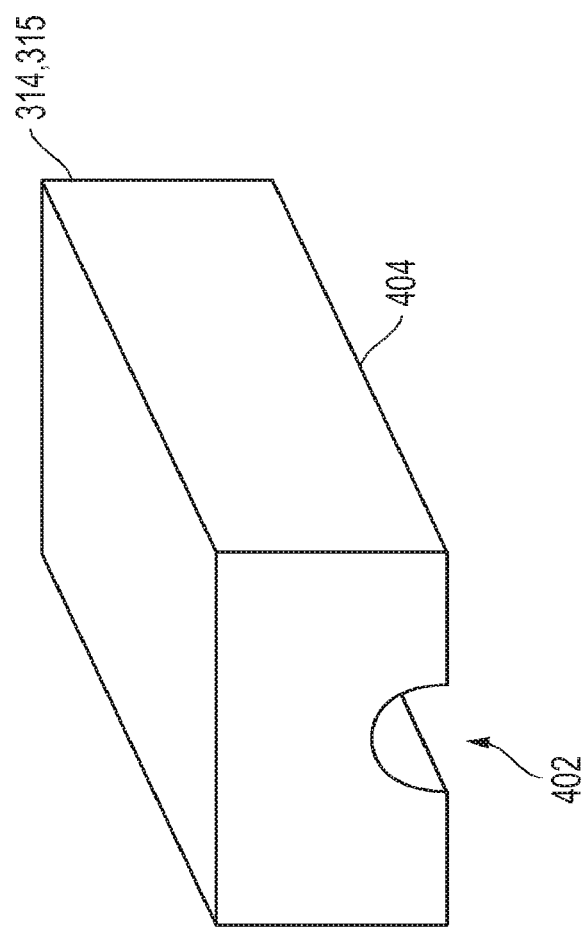
FIG. 4A is a diagram of an exemplary tamping pad in accordance with one embodiment of the present disclosure.

Referring to FIG. 4A, a diagram of an exemplary tamping pad is depicted in accordance with one embodiment of the present disclosure. In this embodiment, tamping pads 314 and 315 comprise a groove 402 that is cut according to the outer profile of the moving cable or conduit 100. Labels 200A and/or 200B are fed onto the face 404 of tamping pads 314 and 315. When the set of hydraulics of the tamping devices 304 and 309 drive tamping pads 314 and 315 onto the moving cable or conduit 100, the cable or conduit 100 fits into the groove 402 of the tamping pads 314 and 315 and labels 200A and/or 200B are affixed to the moving cable or conduit 100 according to the profile provided by the groove 402. For example, the set of hydraulics may drive tamping pads 314 and 315 from above the moving cable or conduit 100 by descending it downwards. Alternatively, the set of hydraulics may drive the tamping pads 314 and 315 from below the moving cable or conduit 100 by lifting it upward.

After a predetermined amount of time delay, the set of hydraulics of the tamping devices 304 and 309 remove tamping pads 314 and 315 from the moving cable or conduit 100. For example, the set of hydraulics may remove tamping pads 314 and 315 by lifting it away from the top of moving cable or conduit 100. Alternatively, the set of hydraulics may remove tamping pads 314 and 315 by descending it downward away from the bottom of moving cable or conduit 100. Tamping pads 314 and 315 are interchangeable based on the diameter of the moving cable or conduit 100. In this way, tamping devices 304 and 309 may accommodate cable or conduits or conduits with different diameters by simply replacing tamping pads 314 and 315.

Figure 4B:
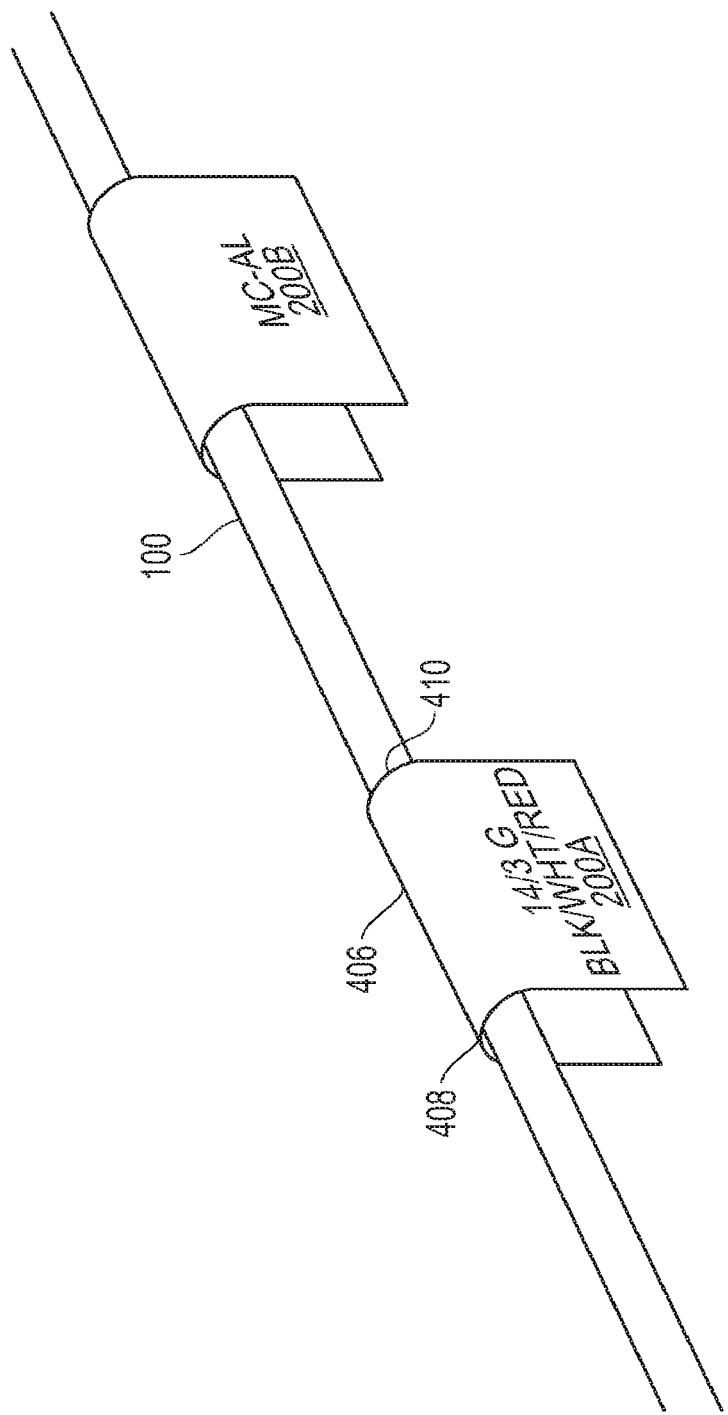
FIG. 4B is a diagram of an exemplary moving cable or conduit after initial affixing of labels by the tamping device in accordance with one embodiment of the present disclosure.

Referring to FIG. 4B, a diagram of an exemplary moving cable or conduit after initial affixing of labels by tamping devices 304 and 309 is depicted in accordance with one embodiment of the present disclosure. In this embodiment, after tamping devices 304 and 309 drive tamping pads 314 and 315 onto the moving cable or conduit 100, at least half of the circumference of the moving cable or conduit 100 is affixed with labels 200A and/or 200B after tamping pads 314 and 315 are removed. Thus, affixed labels 200A and/or 200B cover the top portion 406, a first side 408 of the moving cable or conduit 100, and a second side 410 of the moving cable or conduit 100.

Figure 5:
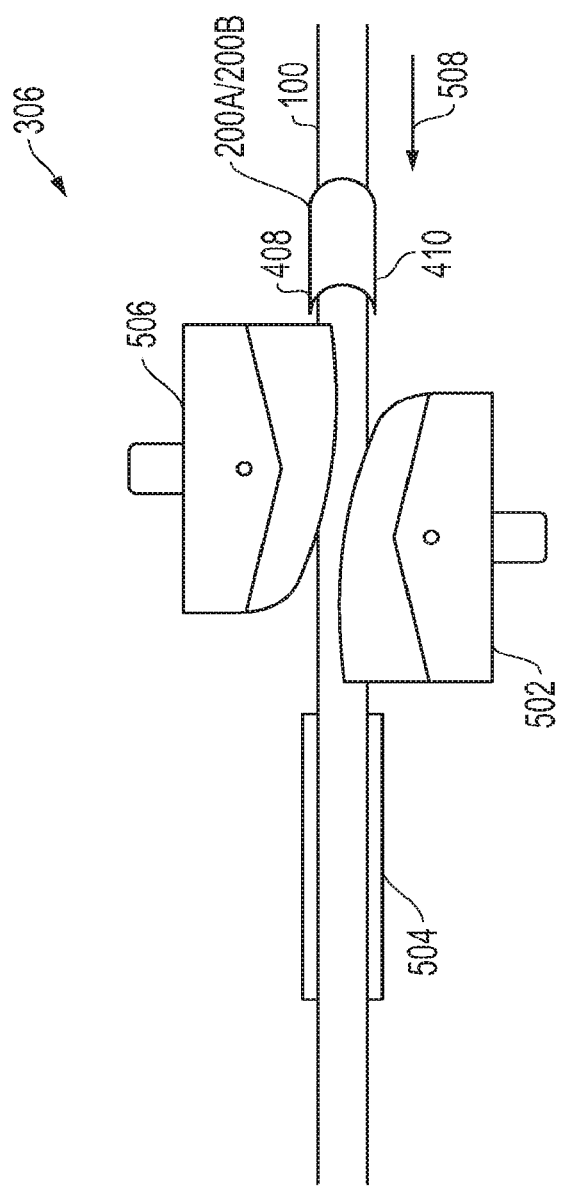
FIG. 5 is a diagram of a top view of a guide shoe assembly is depicted in accordance with one embodiment of the present disclosure.

After initial affixing of labels 200A and/or 200B to the moving cable or conduit 100, a guide shoe assembly 306 directs the moving cable or conduit 100 while smoothing or rounding labels 200A and/or 200B to tightly fit the outer profile of the moving cable or conduit 100. Referring to FIG. 5, a diagram of a top view of a guide shoe assembly 306 is depicted in accordance with one embodiment of the present disclosure. Guide shoe assembly 306 comprises three main parts: guide shoe 502, guide shoe 504, guide shoe 506. In one embodiment, dimensions of guide shoe 502 and guide shoe 504 are identical while dimensions of guide shoe 506 are different from guide shoes 502 and 504. As moving cable or conduit 100 enters guide shoe assembly 306 in direction 508 with initially affixed label 200, guide shoe 506 rounds and presses labels 200A and/or 200B against a first side 408 of the moving cable or conduit 100. In this embodiment, guide shoe 506 is mounted at a level that is horizontally even with the moving cable or conduit 100, such that guide shoe 506 presses the labels directly against the first side 408 of the moving cable or conduit 100 as the labels pass through guide shoe 506. The moving cable or conduit 100 then enters guide shoe 502 in direction 508, which rounds and presses labels 200A and/or 200B against a second side 410 of the moving cable or conduit 100. In this embodiment, guide shoe 502 is also mounted at a level that is horizontally even with the moving cable or conduit 100, such that guide shoe 502 presses the labels directly against the first side 408 of the moving cable or conduit 100.

Next, the moving cable or conduit 100 enters guide shoe 504 in direction 508, which rounds and presses labels 200A and/or 200B against the bottom portion (not shown) of the moving cable or conduit 100. In this embodiment, guide shoe 504 is perpendicular to guide shoes 502 and 506 and is mounted directly under the moving cable or conduit 100. Once the moving cable or conduit 100 with affixed labels 200A and/or 200B pass guide shoe 504, labels 200A and/or 200B completely wrap around the moving cable or conduit 100. In this example, a portion of guide shoe 506 overlaps a portion of guide shoe 502 to provide smooth transition of labels 200A and/or 200B and the moving cable or conduit 100 from guide shoe 506 to guide shoe 502. However, a portion of guide shoe 506 does not have to overlap a portion of guide shoe 502 to round labels 200A and/or 200B to fit the outer profile of moving cable or conduit 100.

In the case of a method for applying labels other than heated shrink-wrap, such as adhesive labels, labeling unit 300 may be modified such that the opposing ends of labels 200A and/or 200B are joined after labels 200A and/or 200B pass the guide shoe assembly 306. For example, only guide shoes 506 and 502 are used to press and round the first 408 and second sides 410 of the moving cable or conduit 100. In one embodiment, guide shoes 506 and 502 are identical and may either be of a type as described in FIGS. 7A and 7B or FIGS. 8A and 8B. In this embodiment, the spacing between guide shoe 506 and guide shoe 502 is adjusted, such that labels 200A and/or 200B completely exit guide shoe 506 prior to entering guide shoe 502. In this way, a first end of labels 200A and/or 200B is applied to the first side 408 of the moving cable or conduit 100 before the second end of labels 200A and/or 200B is applied to the second side 410 of the moving cable or conduit 100 and joined with the first end.

Referring to FIGS. 6A to 6C, diagrams illustrating side views of exemplary guide shoes are depicted in accordance with one embodiment of the present disclosure. According to FIG. 6A, guide shoe 506 comprises a rounding member 602, a rounding member support 604, a set of springs 606, a set of pivots 608, a fitted member 610, and a support mount 612. The rounding member 602 rounds and presses labels 200A and/or 200B against a first side 408 of the moving cable or conduit 100 as it passes guide shoe 506. The rounding member 602 is supported by the rounding member support 604 and a set of springs 606 are disposed between the rounding member 602 and the rounding member support 604.

The set of springs 606 provide flexibility to the rounding member 602 when the moving cable or conduit 100 passes guide shoe 506. The flexibility of the rounding member 602 provided by the set of springs 606 allows the moving cable or conduit 100 to transition smoothly from guide shoe 506 to guide shoe 502. The set of springs 606 are adjusted using a set of pivots 608 that are disposed between the rounding member 602 and the rounding member support 604. In addition to providing transition between guide shoes, the set of springs 606 makes it easier for the rounding member 602 to adjust to the outer profile of moving cable or conduit 100 when it passes guide shoe 506 and presses labels 200A and/or 200B against a first side 408 the moving cable or conduit 100.

The fitted member 610 provides an anchor for the guide shoe 506 to connect with the support mount 612. The support mount 612 is mounted to the labeling unit 300 such that the guide shoe 506 is fixedly mounted to the labeling unit 300. This provides stability for the moving cable or conduit 100 as it passes through the guide shoe 506.

According to FIG. 6B, guide shoe 502 also comprises a rounding member 602, a rounding member support 604, a set of springs 606, a set of pivots 608, a fitted member 610, and a support mount 612. The rounding member 602 rounds and presses the label 200A and/or 200B against a second side 410 of the moving cable or conduit 100 as it passes guide shoe 502. Similar to guide shoe 506, guide shoe 502 also comprises a set of springs 606 to provide flexibility for the rounding member 602, such that the moving cable or conduit 100 may transition smoothly from guide shoe 502 to guide shoe 504 when the moving cable or conduit 100 passes through the guide shoe 502. In addition, the set of springs 606 makes it easier for the rounding member 602 to adjust to the outer profile of moving cable or conduit 100 as it passes guide shoe 502 and presses the label 200A and/or 200B against a second side 410 of the moving cable or conduit 100.

According to FIG. 6C, guide shoe 504 also comprises a rounding member 602, a rounding member support 604, a set of springs 606, a set of pivots 608, a fitted member 610, and a support mount 612. The rounding member 602 rounds and presses labels 200A and/or 200B against a bottom portion 616 of the moving cable or conduit 100 as it passes guide shoe 504. Similar to guide shoes 502 and 506, guide shoe 504 also comprises a set of springs 606 to provide flexibility for the rounding member 602, such that the moving cable or conduit 100 may transition smoothly from guide shoe 504 to the set of parallel guide rollers 308 when the moving cable or conduit 100 passes through guide shoe 504. After the moving cable or conduit 100 passes through the rounding member 602 of guide shoe 504, labels 200A and/or 200B completely wraps around the outer profile of the moving cable or conduit 100 before it reaches the set of parallel guide rollers 308.

In this embodiment, guide shoes 502 and 506 are mounted horizontally against both sides of the moving cable or conduit. Thus, guide shoe 502 is mounted at a level that is horizontally even with the moving cable or conduit 100 such that it is directly facing the first side 408 of the moving cable or conduit 100. Similarly, guide shoe 506 is also mounted at a level that is horizontally even with the moving cable or conduit 100, such that it is facing directly to a second side 410 of the moving cable or conduit 100. Also in this embodiment, guide shoe 504 is mounted at an angle directly facing the bottom portion 616 of the moving cable or conduit 100. In this embodiment, guide shoe 504 is perpendicular to guide shoes 502 and 506 and is mounted directly under the moving cable or conduit 100.

However, guide shoes 502, 504 and 506 may be mounted at any angle facing the first side 408, the second side 410, and the bottom portion 616 of the moving cable or conduit 100 without departing the spirit and scope of the present disclosure. For example, guide shoe 506 may be mounted at an angle closer to guide shoe 504 or the bottom portion 616 of the moving cable or conduit 100 to provide a smooth transition between guide shoe 502 and guide shoe 504.

Figure 7A:
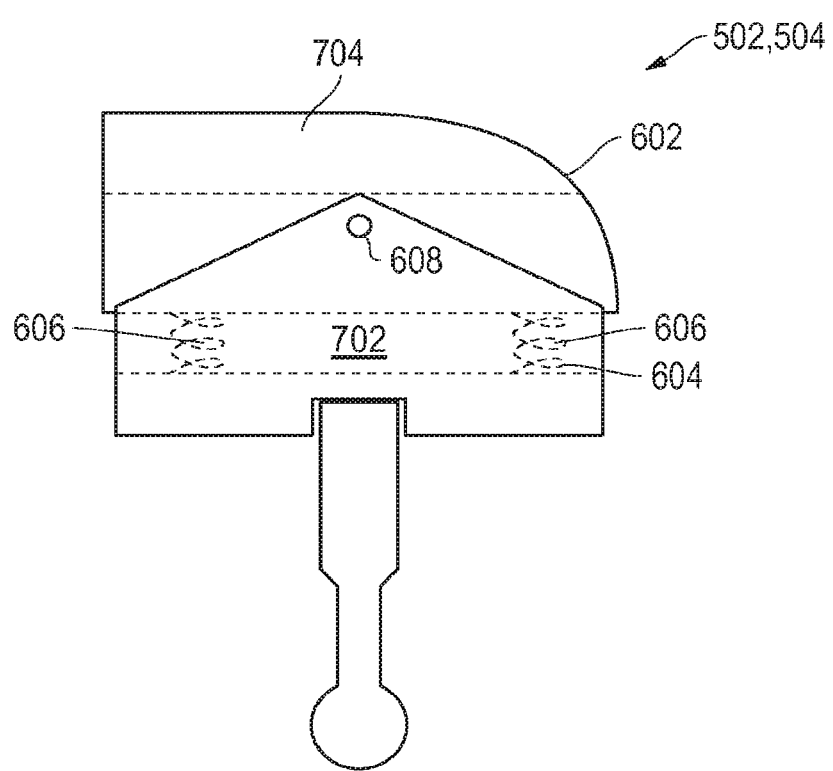
FIG. 7A is a diagram illustrating a side view of an exemplary guide shoe in accordance with one embodiment of the present disclosure.

Referring to FIG. 7A, a diagram illustrating a first side view of an exemplary guide shoe is depicted in accordance with one embodiment of the present disclosure. In this example, guide shoes 502 and 504 comprise a rounding member 602 and a rounding member support 604. The rounding member support 604 comprises a hollow portion 702 in which the set of springs 606 are located. In this embodiment, the set of springs 606 are located on opposite sides of the rounding member support 604 to provide flexibility to the rounding member 602 as the moving cable or conduit 100 passes guide shoes 502 and 504 and when the rounding member 602 presses the label 200 against a second side 410 and a bottom portion 616 of the moving cable or conduit 100.

The rounding member 602 also comprises a hollow portion 704, which fits the outer profile of the moving cable or conduit 100 as it passes guide shoes 502 and 504. When guide shoe 502 or 504 is mounted, the hollow portion 704 directly faces the second side 410 or the bottom portion 616 of the moving cable or conduit 100. A set of pivots 608 are disposed in the center of rounding member 602, which connects the rounding member 602 with the rounding member support 604. The set of pivots 608 allow the set of springs 606 to adjust, such that the rounding member 602 may fit the outer profile of the moving cable or conduit 100 as it passes through guide shoes 502 and 504 and presses labels 200A and/or 200B against a second side 410 and a bottom portion 616 of the moving cable or conduit 100.

Figure 7B:
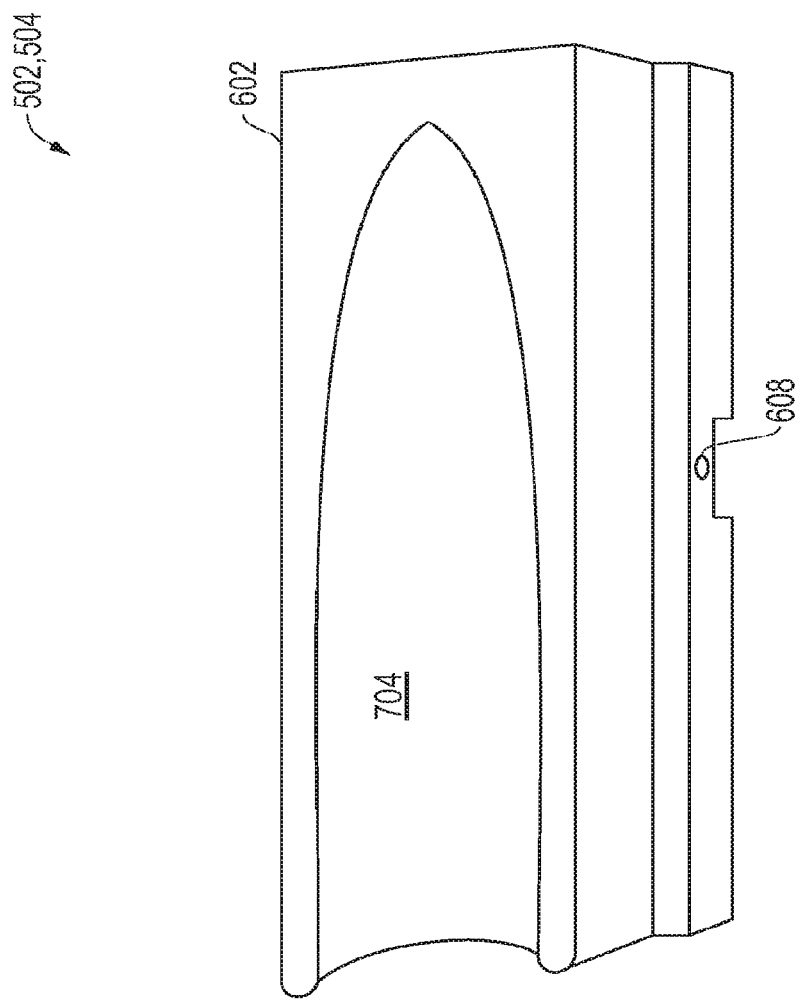
FIG. 7B is a diagram illustrating a top view of a guide shoe in accordance with one embodiment of the present disclosure.

Referring to FIG. 7B, a diagram illustrating a top view of a guide shoe is depicted in accordance with one embodiment of the present disclosure. In this example, the hollow portion 704 of the rounding member 602 has a V-shape, which rounds and presses labels 200A and/or 200B against a second side 410 and/or a bottom portion 616 of the moving cable or conduit 100. However, the hollow portion 704 may have a different shape that facilitates rounding and pressing of labels 200A and/or 200B against the second side 410 and the bottom portion 616 of the moving cable or conduit 100 without departing the spirit and scope of the present disclosure. When the guide shoe 502 or 504 is mounted, the hollow portion 704 directly faces the second side 410 or the bottom portion 616 of the moving cable or conduit 100.

Figure 8A:
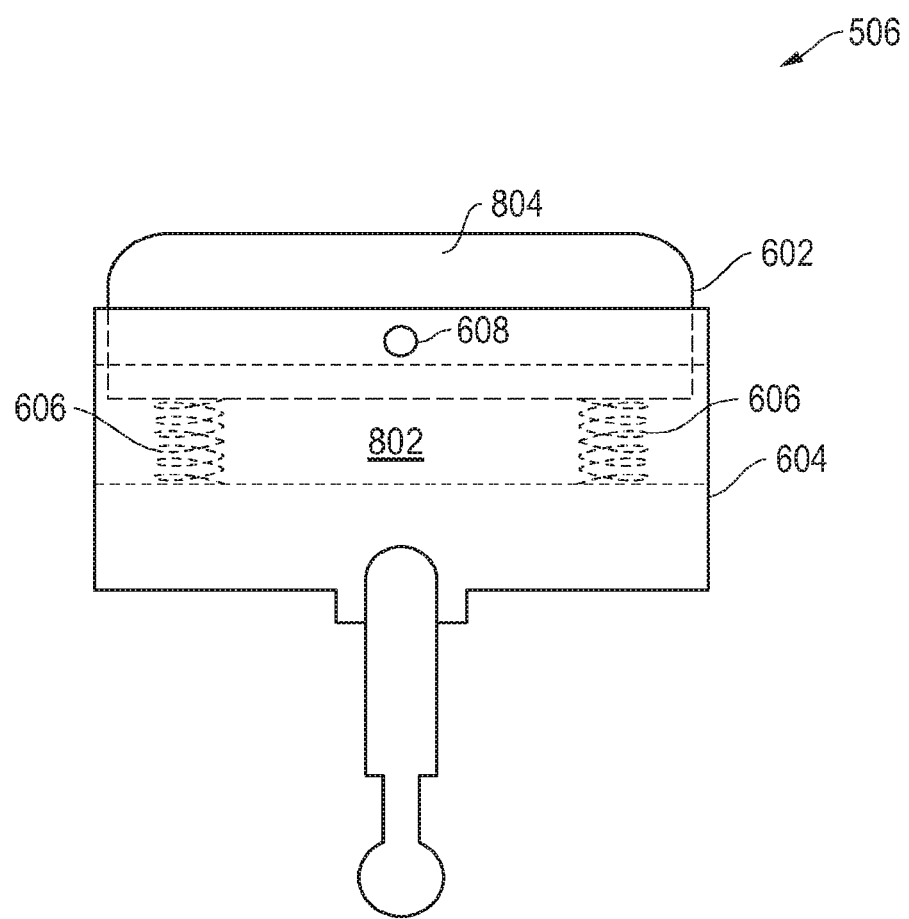
FIG. 8A is a diagram illustrating a side view of a guide shoe in accordance with an alternative embodiment of the present disclosure.

Referring to FIG. 8A, a diagram illustrating a side view of a guide shoe is depicted in accordance with an alternative embodiment of the present disclosure. In this example, guide shoe 506 comprises a rounding member 602 and a rounding member support 604. The rounding member support 604 comprises a hollow portion 802 in which the set of springs 606 are located. In this embodiment, the set of springs 606 are located on opposite sides of the rounding member support 604 to provide flexibility to the rounding member 602, as the moving cable or conduit 100 passes the guide shoe 506 and when the rounding member 602 presses labels 200A and/or 200B against a first side 408 of the moving cable or conduit 100.

The rounding member 602 also comprises a hollow portion 804, which fits the outer profile of the moving cable or conduit 100 as it passes guide shoe 506. When guide shoe 506 is mounted, the hollow portion 804 directly faces the first side 408 of the moving cable or conduit 100. A set of pivots 608 are disposed in the center of rounding member 602, which connects the rounding member 602 with the rounding member support 604. The set of pivots 608 allow the set of springs 606 to adjust, such that the rounding member 602 may fit the outer profile of the moving cable or conduit 100 as it passes through the guide shoe 506 and presses labels 200A and/or 200B directly against the first side 408 of the moving cable or conduit 100.

Figure 8B:
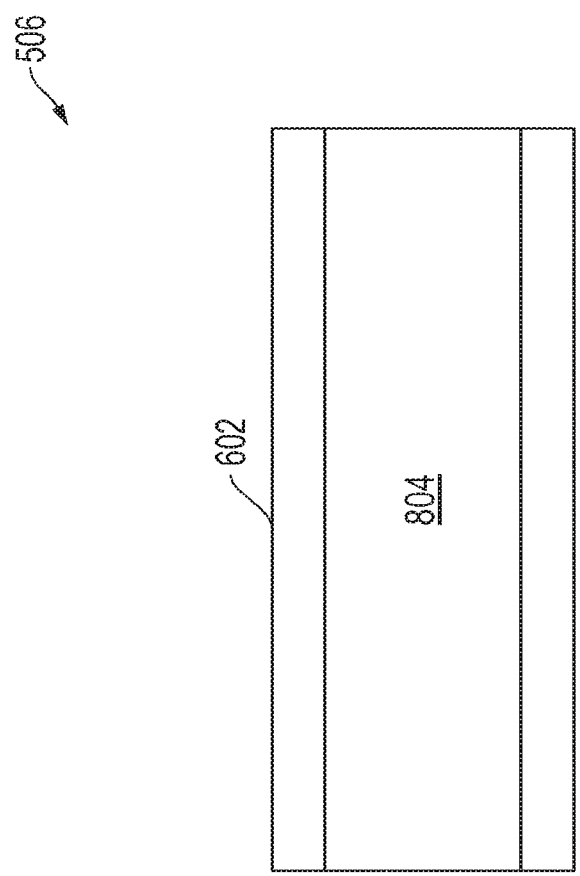
FIG. 8B is a diagram illustrating a side view of a guide shoe in accordance with an alternative embodiment of the present disclosure.

Referring to FIG. 8B, a diagram illustrating a side view of a guide shoe is depicted in accordance with an alternative embodiment of the present disclosure. In this example, the hollow portion 804 extends across the entire body of the rounding member 602. This enables the hollow portion 804 to contact all portions of the moving cable or conduit 100 that pass through guide shoe 506. This allows the moving cable or conduit 100 to pass smoothly as the rounding member 602 rounds and presses the label against a first side 408 of the moving cable or conduit 100.

Referring to FIG. 9, a diagram illustrating an exemplary guide roller is depicted in accordance with one embodiment of the present disclosure. The guide roller 308 may be made of metal or plastic materials. In this embodiment, the guide roller 308 comprises top and bottom portions 902 that guide the moving cable or conduit 100 after exiting guide shoe 504 to hold the cable or conduit in place. The guide roller 308 also comprises a hollow portion 904 that fits the outer profile of the moving cable or conduit 100 such that it presses labels 200A and/or 200B more firmly around the sides of the moving cable or conduit as it passes through the guide roller 308. In this embodiment, the hollow portion 904 comprises a profile that is similar to the outer sheath 106 of the moving cable or conduit 100, such that the label 200A and/or 200B may be more firmly pressed against the moving cable or conduit 100. The size of the guide roller 308 is interchangeable according to the overall diameter of the cable or conduit 100.

After the moving cable or conduit 100 passes through the set of parallel guide rollers 308, the moving cable or conduit 100 with an applied labels 200A and/or 200B passes through an optional encoding wheel 312 that regulates the frequency of label application based on the speed of the moving cable or conduit 100. The frequency of label application reflects how far labels 200A and/or 200B are spaced apart when applied to the moving cable or conduit 100. The frequency may be adjusted based on the size of the guiding wheel 318, which is interchangeable to provide different frequencies.

After the moving cable or conduit 100 passes the optional encoding device 310, the moving cable or conduit 100 may enter an optional heated shrink-wrap tunnel 312 that affixes the applied label 200A and/or 200B more securely onto the moving cable or conduit 100. The tunnel 312 heats the applied labels 200A and/or 200B to a predetermined temperature and causes the applied labels 200A and/or 200B to shrink and tightly wrap around the outer profile of the moving cable or conduit 100. In this way, labels 200A and/or 200B are applied directly to the outer sheath 106 of the moving cable or conduit 100 without the application of ink.

Figure 10:
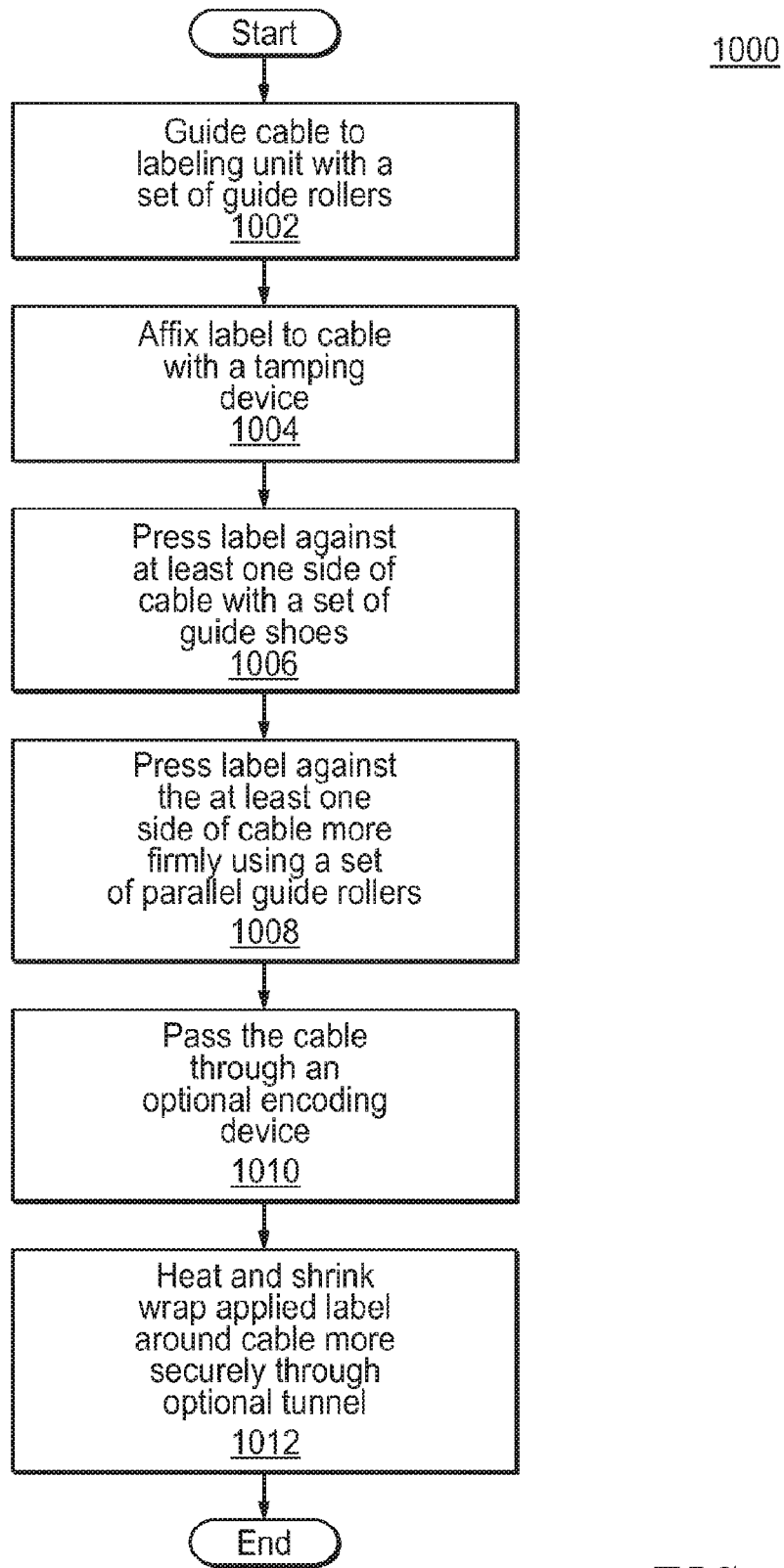
FIG. 10 is a flowchart of a process for applying labels to a cable or conduit in accordance with one embodiment of the present disclosure.

Referring to FIG. 10, a flowchart of a process for applying labels to a cable or conduit is depicted in accordance with one embodiment of the present disclosure. Process 1000 begins at step 1002 to guide a cable or conduit to a labeling unit 300 with a set of guide rollers. Process 1000 then continues to step 1004 to affix a label to the cable or conduit with a tamping device, such as tamping device 304 and/or 309. Process 1000 then continues to step 1006 to press the label against at least one side of the cable or conduit using a set of guide shoes 1006. Process 1000 then continues to step 1008 to press the label more firmly against the at least one side of the cable or conduit using a set of parallel guide rollers. Process 1000 then continues to step 1010 to pass the cable or conduit through an optional encoding device to monitor the frequency of label application. Process 1000 then completes at step 1012 to heat and shrink-wrap the applied label around the outer profile of the cable or conduit more securely through an optional tunnel.

Figure 11:
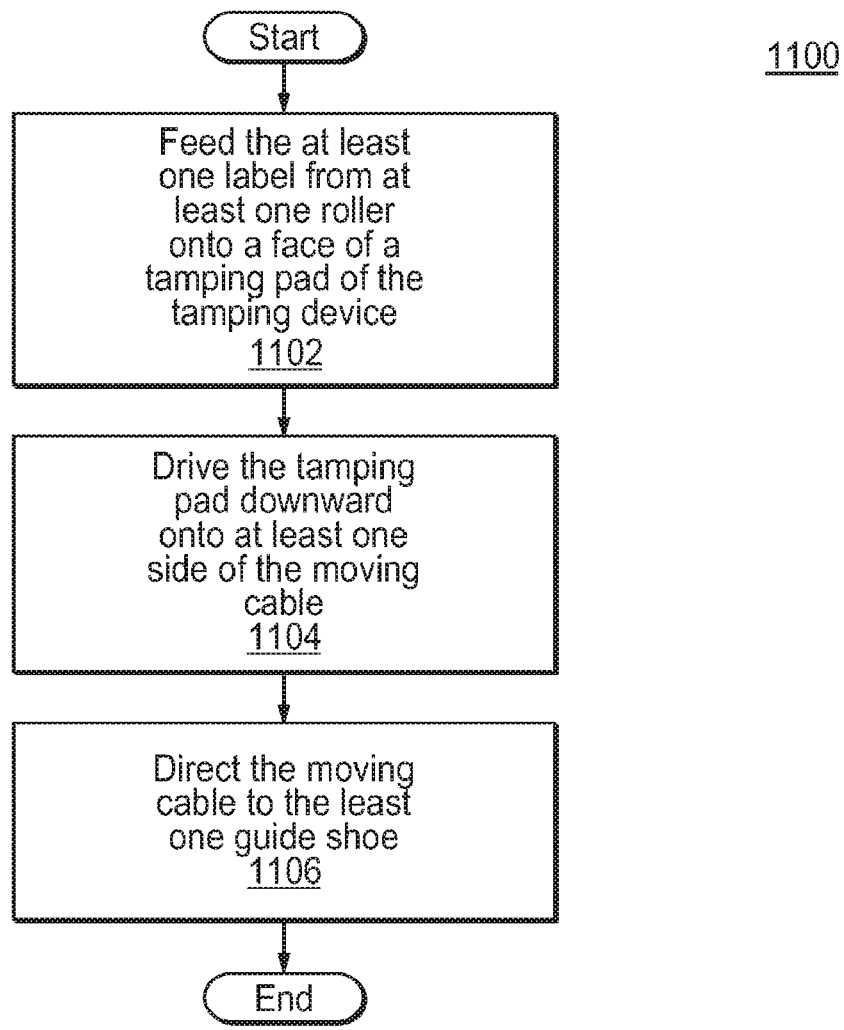
FIG. 11 is a flowchart of a process for affixing labels to a cable or conduit with a tamping device in accordance with one embodiment of the present disclosure.

Referring to FIG. 11, a flowchart of a process for affixing labels to a cable or conduit with a tamping device is depicted in accordance with one embodiment of the present disclosure. Process 1100 begins at step 1102 to feed the at least one label from at least one roller onto a face of the tamping device. Process 1100 then continues to step 1104 to drive the tamping pad of the tamping device downward onto at least one side of the moving cable or conduit. Process 1100 then completes at step 1106 to direct the moving cable or conduit to the at least one guide shoe.

Figure 12:
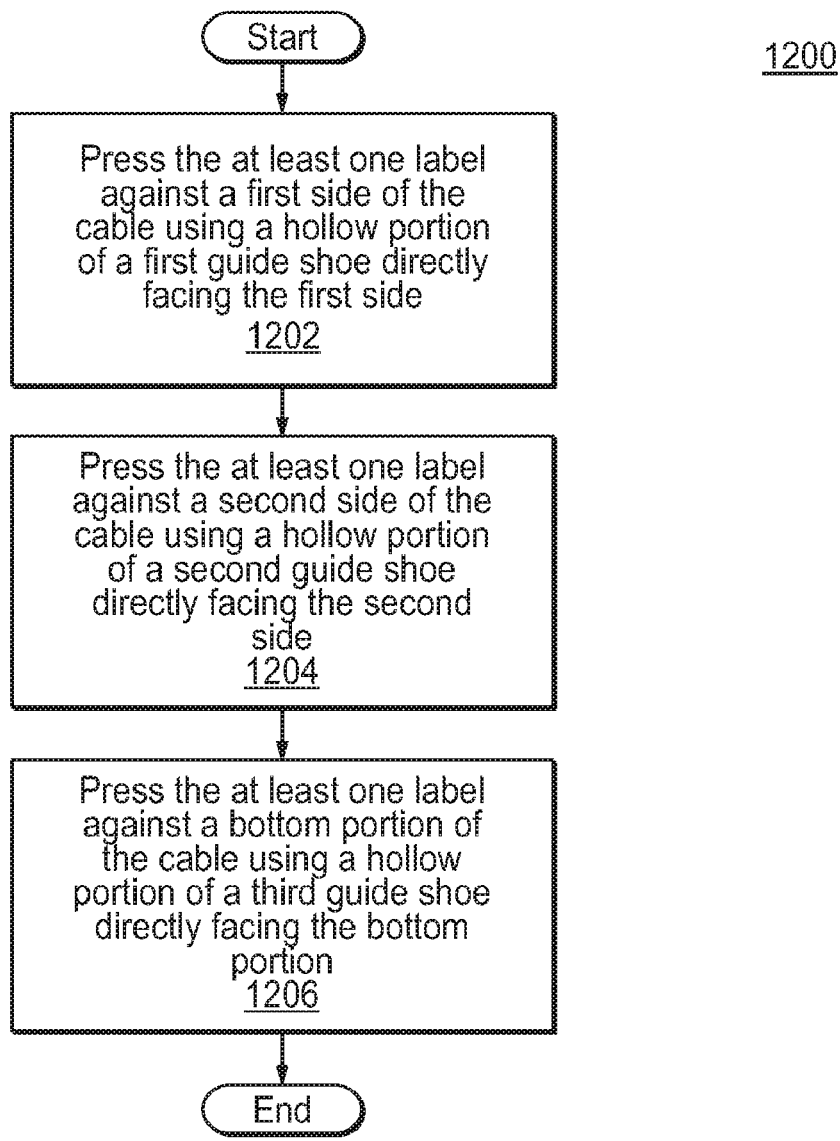
FIG. 12 is a flowchart of a process for pressing the label against at least one side of the cable or conduit using a set of guide shoes.

Referring to FIG. 12, a flowchart of a process for pressing the label against at least one side of the cable or conduit using a set of guide shoes is depicted in accordance with one embodiment of the present disclosure. Process 1200 begins at step 1202 to press at least one label against a first side of the cable or conduit using a hollow portion of the first guide shoe directly facing the first side. Process 1200 continues to step 1204 to press at least one label against a second side of the cable or conduit using a hollow portion of the second guide shoe directly facing the second side. Process 1200 then completes at step 1206 to press the at least one label against a bottom portion of the cable or conduit using a hollow portion of a third guide shoe directly facing the bottom portion.

Although the invention has been shown and described with respect to a certain preferred embodiment or embodiments, it is obvious that equivalent alterations and modifications will occur to others skilled in the art upon the reading and understanding of this specification and the annexed drawings. In addition, while a particular feature of the invention may have been disclosed with respect to only one of several embodiments, such feature may be combined with one or more other features of the other embodiments as may be desired. It is therefore, contemplated that the claims will cover any such modifications or embodiments that fall within the true scope of the invention.

What is claimed is:

1. A system for applying at least one label to cable or conduit, the system comprising:
   at least one label;
   a label applicator for applying the at least one label to the cable or conduit, the label applicator comprising:
      at least one tamping device comprising at least one tamping pad for applying at least one label onto the cable or conduit; and
      at least one guide shoe for pressing the label directly against at least a portion of the cable or conduit, wherein the at least one guide shoe comprises:
         a rounding member;
         at least one spring to the rounding member; and
         a plurality of pivots for adjusting the at least one springs.

2. The system of claim 1, wherein the guide shoe further comprises a rounding member support for supporting the rounding member.

3. The system of claim 1, wherein the at least one guide shoe comprises a hollow portion directly facing at least one side of the cable or conduit.

4. The system of claim 1, wherein the at least one guide shoe is mounted directly under the cable or conduit.

5. The system of claim 1 further comprising at least one guide roller in rotational connection with the cable or conduit and wherein the guide roller guides the cable or conduit after the label is applied.

6. The system of claim 5, wherein the at least one guide roller comprises a top portion and a bottom portion.

7. The system of claim 5, wherein the at least one guide roller comprises at least two guide rollers in parallel.

8. The system of claim 7, wherein the at least two guide rollers further apply the label to the cable or conduit and wherein the point of contact between the at least two guide rollers and the cable or conduit is rotationally different than the contact between the guide shoe and the cable or conduit.

9. The system of claim 7, wherein the distance between the at least two guide rollers is adjustable.

10. The system of claim 2, wherein the guide shoe further comprises a plurality of pivots disposed between the rounding member and a rounding member support.

11. The system of claim 1, wherein the at least one guide shoe comprises at least two guide shoes.

12. The system of claim 11, wherein the at least two guide shoes comprises at least three guide shoes.

13. The system of claim 1, wherein the at least one label comprises a first label and a second label.

14. The system of claim 13, wherein the first label is color-coded to indicate a size of at least one internal conductor of the cable or conduit and the second label is color-coded to indicate a category of the cable or conduit.

15. The system of claim 1, wherein the at least one tamping device comprises a set of hydraulics for driving the at least one tamping pad onto the cable or conduit.

16. The system of claim 1 further comprising an encoding device in rotational connection with the cable or conduit.

17. The system of claim 16, wherein the encoding devices comprises an encoding wheel.

18. The system of claim 16, wherein the encoding device regulates the frequency of applying the at least one label by the at least one tamping device.

19. The system of claim 1, wherein the at least one label comprises letters printed on a surface of the label to indicate size and number of internal conductors.

20. The system of claim 1, wherein the at least one label comprises letters printed on a surface of the label to indicate the colors of the internal conductors.

* * * * *